(12) United States Patent
Ward et al.

(10) Patent No.: US 7,574,688 B1
(45) Date of Patent: Aug. 11, 2009

(54) USING HIGH-LEVEL LANGUAGE FUNCTIONS IN HDL SYNTHESIS TOOLS

(75) Inventors: Jeffrey C. Ward, Thornton, CO (US);
James Ogden, San Jose, CA (US);
Mark R. McLaughlin, El Sobrante, CA (US); Jerome Bertrand, Grenoble (FR);
Michael G. Ingoldby, Boulder, CO (US)

(73) Assignee: XILINX, Inc., San Jose, CA (US)

( * ) Notice: Subject to any disclaimer, the term of this patent is extended or adjusted under 35 U.S.C. 154(b) by 81 days.

(21) Appl. No.: 11/450,222

(22) Filed: Jun. 9, 2006

(51) Int. Cl.
*G06F 17/50* (2006.01)

(52) U.S. Cl. .................... 716/18; 717/140

(58) Field of Classification Search ............. 716/18; 717/139, 140, 143; 703/14
See application file for complete search history.

(56) References Cited

U.S. PATENT DOCUMENTS

| | | | |
|---|---|---|---|
| 5,815,405 A | 9/1998 | Baxter | |
| 5,968,161 A | 10/1999 | Southgate | |
| 6,078,736 A | 6/2000 | Guccione | |
| 6,466,898 B1 | 10/2002 | Chan | |
| 6,470,449 B1 * | 10/2002 | Blandford | 713/178 |
| 6,557,156 B1 | 4/2003 | Guccione | |
| 6,957,423 B1 * | 10/2005 | Ma | 717/137 |
| 7,035,781 B1 * | 4/2006 | Flake et al. | 703/14 |
| 7,117,139 B2 * | 10/2006 | Bian | 703/13 |
| 7,203,912 B2 * | 4/2007 | Moona et al. | 716/3 |
| 7,424,703 B1 * | 9/2008 | Harcourt et al. | 717/136 |
| 2002/0049576 A1 * | 4/2002 | Meyer | 703/14 |
| 2002/0107678 A1 * | 8/2002 | Wu et al. | 703/14 |
| 2002/0133788 A1 * | 9/2002 | Waters et al. | 716/3 |
| 2002/0166110 A1 * | 11/2002 | Powell | 717/106 |
| 2003/0061580 A1 * | 3/2003 | Greaves | 716/4 |
| 2003/0231207 A1 * | 12/2003 | Huang | 345/752 |
| 2004/0143801 A1 * | 7/2004 | Waters et al. | 716/3 |
| 2005/0198606 A1 * | 9/2005 | Gupta et al. | 716/18 |
| 2006/0031791 A1 * | 2/2006 | Moona et al. | 716/3 |
| 2007/0169054 A1 * | 7/2007 | Cheng et al. | 717/156 |

OTHER PUBLICATIONS

U.S. Appl. No. 11/642,179, filed Dec. 19, 2006, Ingoldby, Michael George, et al., "Methods of Generating a Design Architecture Tailored to Specified Requirements of PLD Design", Xilinx, Inc., 2100 Logic Drive, San Jose, CA.

Tessier, Russell, et al., "Power-aware RAM Mapping for FPGA Embedded Memory Blocks", FPGA '06; pp. 1-10, Feb. 22-24, 2006; Monterey, CA.

"Virtex-4 User Guide", Version v1.5; UG070, published Mar. 21, 2006; pp. 109-161, Xilinx, Inc., 2100 Logic Drive, San Jose, CA.

\* cited by examiner

*Primary Examiner*—Paul Dinh
*Assistant Examiner*—Nha T Nguyen
(74) *Attorney, Agent, or Firm*—Kevin T. Cuenot

(57) ABSTRACT

A method of integrating a High-level Language (HLL) function with a Hardware Description Language (HDL) representation of a circuit design can include identifying an attribute of the HDL representation of the circuit design that is resolved at compile time and determining a value for the attribute using an HLL function when compiling the HDL representation of the circuit design.

19 Claims, 2 Drawing Sheets

USING HIGH-LEVEL LANGUAGE FUNCTIONS IN HDL SYNTHESIS TOOLS

BACKGROUND

1. Field of the Invention

The present invention relates to the field of circuit design and, more particularly, to implementing High-Level Language functions in Hardware Description Language synthesis tools.

2. Description of the Related Art

Electronic circuit designs are commonly specified in programmatic form using a Hardware Description Language (HDL) such as Verilog or VHDL. The use of an HDL allows a circuit designer to design and document an electronic system at various levels of abstraction. For example, circuit designs to be implemented in programmable logic devices, such as field programmable gate arrays or application specific integrated circuits, can be modeled using an HDL. The HDL design can be simulated and tested using an appropriate software-based synthesis tool.

A synthesis tool can process the abstract HDL representation of the circuit design and translate the HDL design into a less abstract implementation in terms of actual logic gates. The output of a synthesis tool can be specified in any of a variety of different forms including, but not limited to, a netlist or a bitstream. One example of a synthesis tool is the Xilinx® Synthesis Tool (XST), which is available from Xilinx Inc. of San Jose, Calif.

Some HDL designs can be parameterized. A parameterizable design refers to one in which one or more attributes of the design are determined at compile time. This can be the case, for example, with respect to IP cores. An attribute, whether a VHDL generic, a Verilog parameter, or any other attribute of an HDL design, can be determined using one or more HDL constant functions. Examples of circuit design attributes can include, but are not limited to, bus widths, a number of instantiations for a particular circuit component, or the like.

An HDL constant function is one that receives a compile-time constant as input and produces an HDL compile-time constant as an output, i.e., a circuit attribute. Thus, an HDL constant function is executed at compile time and calculates a value for a circuit attribute. The HDL constant function typically is incorporated into a synthesizable HDL design in that the HDL design is implemented in hardware. The HDL constant function itself, however, is not translated into hardware and, as such, is generally not synthesized. Instead, one or more attributes determined by the HDL constant function are used during synthesis.

In illustration, one example of an HDL constant function can be one that drives HDL generate statements to control the structure of the circuit in an effort to optimize the circuit for speed, minimal resource usage, or optimal power usage. Such an HDL constant function is executed at compile time by the synthesis tool. The values determined for the various HDL circuit attributes would then be used during synthesis of the HDL design by the synthesis tool.

As their name suggests, HDL constant functions are coded in an HDL. From the above example, it can be seen that an HDL constant function can be relatively complex. HDLs, however, are unable to utilize, or have a limited ability to employ, the types of abstractions needed to efficiently implement complex algorithms or data manipulations. For example, HDLs typically have limited data types and lack complicated data-type abstraction and conversion facilities. These limitations make it difficult to efficiently perform the more complex operations commonly found within HDL constant functions. In consequence, the time needed to develop and/or maintain an HDL constant function can be significant. Further, the execution of an HDL constant function can be time consuming, thereby contributing to increased synthesis times.

It would be beneficial to provide a technique that is capable of efficiently calculating various circuit design attributes in a manner that overcomes the limitations described above.

SUMMARY

The present invention provides methods and articles of manufacture relating to the use of High-Level Language (HLL) functions with Hardware Description Language (HDL) synthesis tools. One embodiment of the present invention can include a method of integrating an HLL function with an HDL representation of a circuit design. The method can include identifying an attribute of the HDL representation of the circuit design that is resolved at compile time and determining a value for the attribute using an HLL function when compiling the HDL representation of the circuit design.

The method also can include using the value for the attribute during synthesis of the HDL representation of the circuit design. The determination of the value can include calling the HLL function and executing the HLL function. The attribute can be an HDL constant, such that determining the value can include assigning an output of the HLL function to the HDL constant.

The method further can include specifying an object library to be accessed during compilation of the HDL representation of the circuit design. The object library can include the HLL function. A directive can be identified within the HDL representation of the circuit design that instructs a synthesis tool to select, at compile time, the HLL function to compute the value for the attribute. The directive can be ignored by a synthesis tool if the synthesis tool is incapable of calling the HLL function.

Another embodiment of the present invention can include a method of integrating an HLL function with synthesizable program code. The method can include identifying an HDL constant function within an HDL representation of a circuit design. The HDL constant function can be associated with an HLL function. The method also can include selecting, at compile time, the HLL function and determining, at compile time, a value for an attribute of the HDL representation of the circuit design using the HLL function.

Determining the parameter at compile time can include calling the HLL function and executing the HLL function in lieu of the HDL constant function. The attribute can be an HDL attribute. Accordingly, output of the HLL function can be written to the HDL attribute otherwise determined by the HDL constant function.

The method also can include synthesizing the HDL representation of the circuit design using the value of the attribute determined by the HLL function. The HDL constant function can be associated with the HLL function by instructing a synthesis tool to select the HLL function in lieu of the HDL constant function. One or more instructions can be included within the HDL representation of the circuit design that can be ignored by a synthesis tool if the synthesis tool is incapable of calling the HLL function. An object library also can be specified. The object library can be accessed by the synthesis tool when compiling the HDL representation of the circuit design and can include the HLL function.

Yet another embodiment of the present invention can include a machine readable storage, having stored thereon a computer program having a plurality of code sections for causing a machine to perform the various steps and/or implement the components and/or structures disclosed herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention provides a solution for incorporating High-Level Language (HLL) functionality, as it relates to determining circuit attributes, with a synthesis tool. In accordance with the embodiments disclosed herein, one or more HDL constant functions relating to a Hardware Description Language (HDL) representation of a circuit design (HDL design) can be implemented using HLL versions, or equivalents, of the HDL constant functions. When the HDL design is compiled by the synthesis tool, the HLL function(s) can be executed to determine or calculate values for various circuit attributes. Since the HLL functions can support more robust data manipulation techniques and can execute natively within a computer system, circuit attributes can be calculated in significantly less time than were such attributes to be calculated through the use of HDL constant function(s). Moreover, the time needed for development and/or maintenance of HLL functions can be significantly less than the time needed for development and/or maintenance of HDL constant functions.

Figure 1:
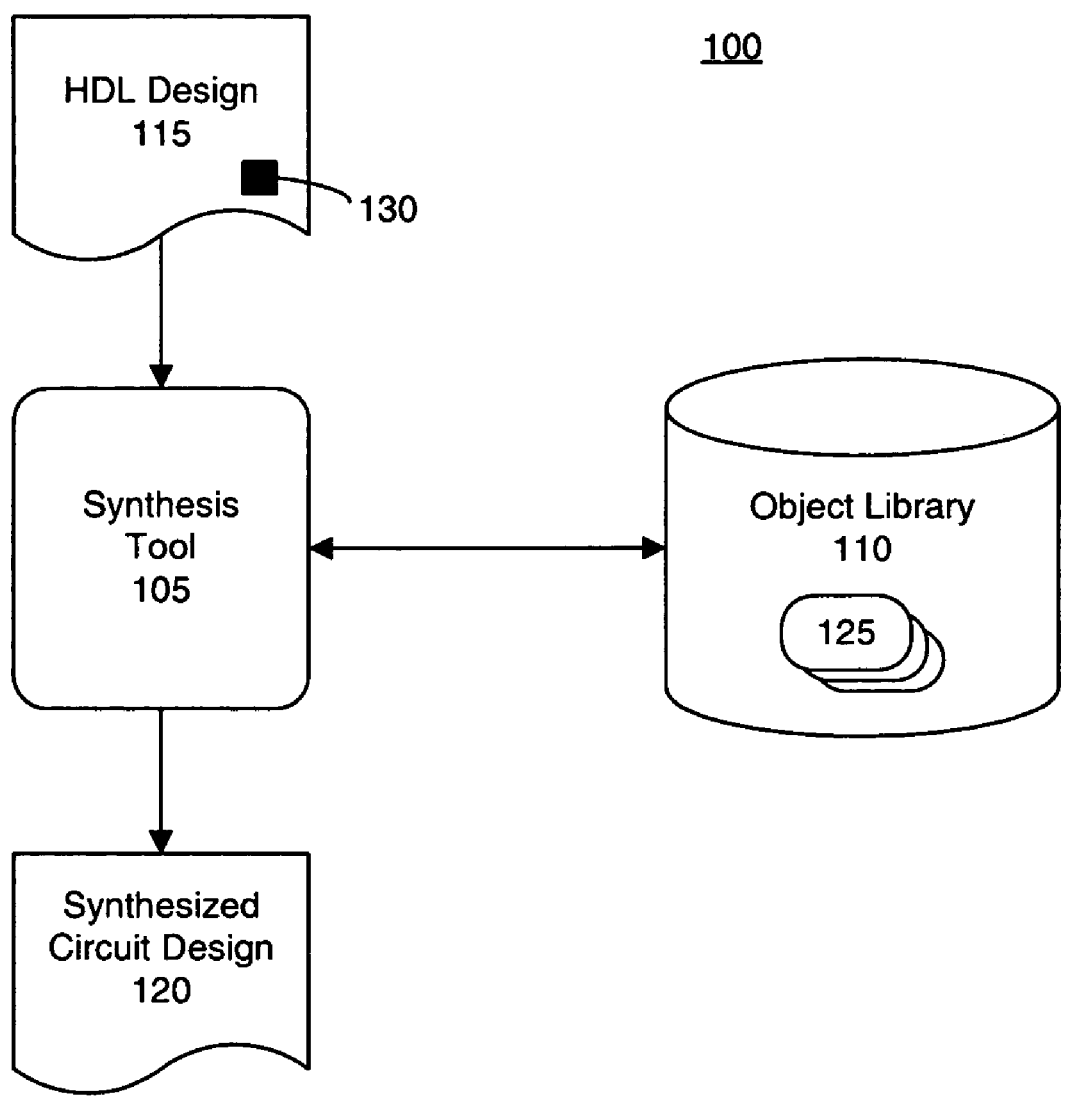
FIG. 1 is a schematic diagram illustrating a system for use in synthesizing a programmatic representation of a circuit design in accordance with one embodiment of the present invention.

FIG. 1 is a schematic diagram illustrating a system 100 for use in synthesizing a programmatic representation of a circuit design in accordance with one embodiment of the present invention. As shown, system 100 can include a synthesis tool 105 and an object library 110. The synthesis tool 105 can process an HDL design 115 comprising synthesizable code. The synthesis tool 105 can translate the HDL design 115 into a logic gate implementation, shown as synthesized circuit design 120, for example for use, or implementation on, a target programmable logic device (PLD). It should be appreciated that while embodiments of the present invention are described with reference to a PLD, the techniques disclosed herein also can be applied and/or used for a variety of different integrated circuits including, but not limited to, application specific integrated circuits (ASICs).

Synthesis tool 105 can be a computer program configured to execute one or more HLL functions to be used along with synthesizable code. The HLL functions can be used in lieu of HDL constant functions that are evaluated at compile time. In one embodiment, synthesis tool 105 can be implemented as the Xilinx® Synthesis Tool (XST), which is available from Xilinx, Inc. of San Jose, Calif. Still, it should be appreciated that any of a variety of different software-based synthesis tools can be used if configured as described herein.

The object library 110 can include one or more HLL functions 125 that are accessible by the synthesis tool 105. Each of the HLL functions 125, when executed, can calculate one or more attributes of HDL design 115. The HLL functions 125 can be executed at compile time to determine various circuit attributes needed for synthesizing HDL design 115. As noted, a circuit attribute can include, but is not limited to, a VHDL generic, a Verilog parameter, or any other attribute of an HDL circuit design. Though the HLL functions 125 are not synthesizable, the HLL functions 125 can be used to perform tasks including, but not limited to, assigning constants, controlling generate statements, and performing calculations and file accesses. Further examples of circuit attributes that can be determined using one or more HLL functions 125 can include performing memory depth and address port width calculations.

The HLL functions 125 are HLL implementations, or versions, of HDL constant functions. That is, the HLL functions 125 can be functionally equivalent to HDL constant functions, but implemented in an HLL such as C++ or the like. It should be appreciated that the particular HLL in which the HLL functions 125 are written is not intended to limit the present invention. Rather, any suitable HLL can be used, particularly an HLL that provides convenient data types and/or manipulations for implementing a given constant function. For example, it may be the case that, given the algorithm implemented in the constant function, C pointers and classes are desirable. In another example, it may be the case that Perl regular expressions are desirable. Further, the HLL functions 125 can be compiled such that the HLL functions 125 can be executed natively by a computer system.

The HDL design 115 can include one or more instructions 130 that instruct the synthesis tool 105 to call and execute one or more appropriate HLL functions 125 from object library 110. As synthesis tool 105 begins to process HDL design 115, the instructions, or synthesis tool directives, can be identified and interpreted by synthesis tool 105. Accordingly, HLL functions 125 indicated by instructions 130 can be called and executed at compile time. The HLL functions 125 can execute in less time than their HDL counterparts. Such is the case as HLL functions 125 can utilize more sophisticated data manipulation constructs than are available in HDL constant functions. Further, HDL constant functions must be analyzed or interpreted by synthesis tool 105 whereas HLL functions 125, being compiled, execute natively on the host computer system. Also, as noted, the time needed for development and/or maintenance of HLL functions can be significantly less than their HDL counterparts.

In one embodiment, where HDL design 115 is coded in VHDL, one or more attribute statements can be used to specify the particular HLL function(s) 125 to be used. Consider the following statements which are examples of instructions 130 that can be included in HDL design 115 and interpreted by synthesis tool 105.

attribute "precompiled_package" of my_hdl_function is: "library.so"

attribute "precompiled_function" of my_hdl_function is: "my_c_function"

In this example, the attribute statement is used within a VHDL implementation of HDL design 115 to specify object library 110 (e.g., library.so) as well as particular ones of HLL function(s) 125 (e.g., my_c_function) that are to be called and executed from object library 110.

In another embodiment, where HDL design 115 is coded in Verilog, another form of an attribute statement can be used. Consider the following example.

(* precompiled_function="library.so my_c_function"*)

In this example, a single statement specifies both the particular HLL function 125 to be called and executed and object library 110 from which the identified HLL function 125 is called. It should be appreciated, however, that this need not be the case. The HLL function to be called and/or object library from which the HLL function is called can be specified using a single statement or a plurality of statements according to the requirements of the particular HDL used.

The examples described above maintain portability of the HDL design 115. That is, synthesis tool 105, which is configured to process statements 130, can identify and process statements 130 at compile time. Synthesis tool 105 can call the appropriate HLL function(s) 125 from the identified object library 110. If HDL design 115 is loaded and synthesized by a synthesis tool that does not support such functionality, i.e., instructions 130, the statements can be ignored. In that case, HDL constant functions that are either included within HDL design 115 or are accessible to the synthesis tool can be executed in lieu of HLL function(s) 125.

In another embodiment of the present invention, HLL functions 125 can be accessed using an import keyword functionality provided by selected HDLs. Verilog, for example, provides SystemVerilog DPI, which stands for Direct Programming Interface. SystemVerilog DPI allows a developer to intermingle HLL code, such as C code, with Verilog code. DPI refers to the interface between SystemVerilog and C that allows inter-language function calls. Consider the following example statement.

import "DPI-C" function int my_junction (input int my_input);

This example illustrates one way in which an HLL function 125 can be called or otherwise accessed using the SystemVerilog DPI functionality.

The embodiments discussed with reference to FIG. 1 indicate that the HLL functions provided are functionally equivalent, or similar, to HDL constant functions. It should be appreciated that providing both alternatives as discussed above is but one embodiment of the present invention. Such an embodiment preserves the portability of the code, but requires the development and/or maintenance of two versions of the function(s).

In another embodiment an HLL function can be provided or called without any corresponding HDL constant function. In still another embodiment, the HDL constant function can be provided as an empty shell, while the HLL function contains the full and complete solution. These solutions relieve the designer from having to develop two independent solutions, i.e., an HDL and an HLL function. In yet another embodiment, the HDL constant function can include a less complicated version or algorithm, while the HLL function includes a more sophisticated or robust solution. In that case, portability is maintained, but tools capable of executing HLL functions can take advantage of more sophisticated and/or complex solutions.

Figure 2:
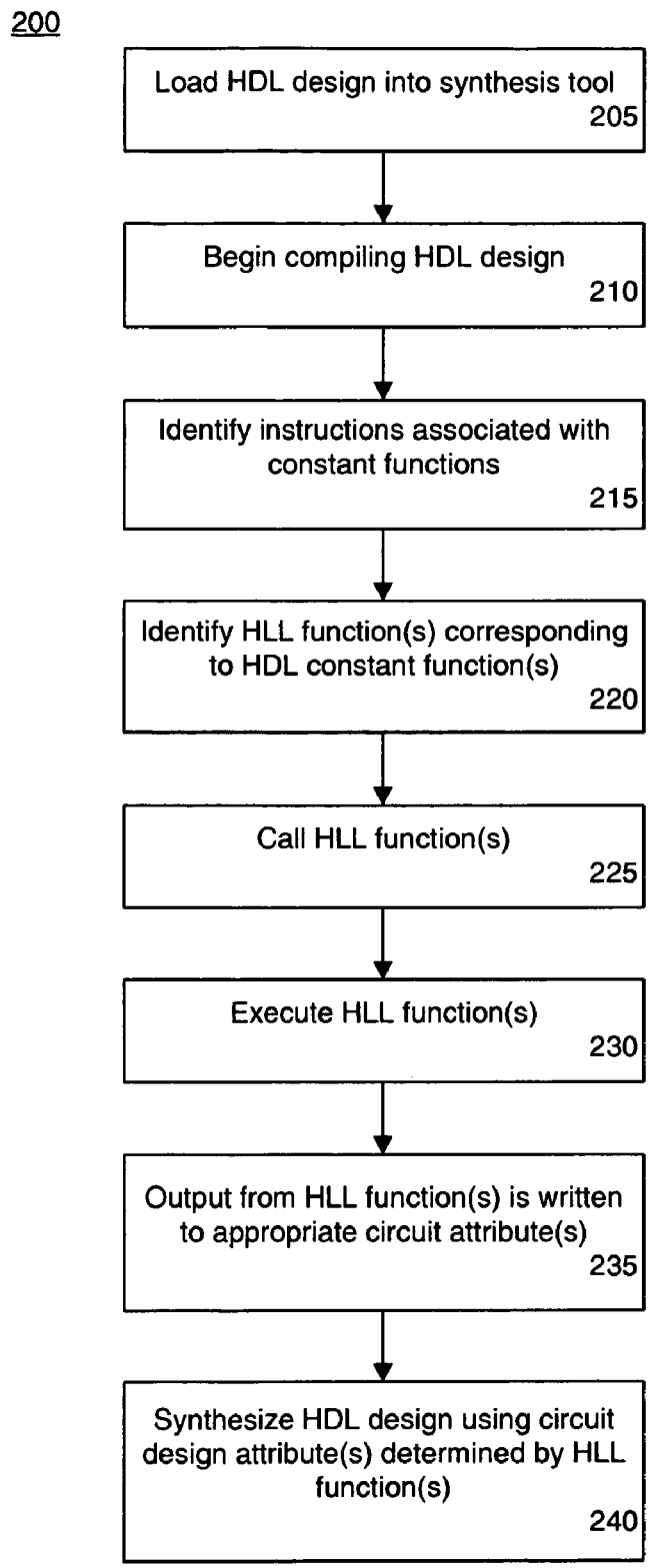
FIG. 2 is a flow chart illustrating a method of synthesizing a programmatic representation of a circuit design in accordance with another embodiment of the present invention.

FIG. 2 is a flow chart illustrating a method 200 of synthesizing a programmatic representation of a circuit design in accordance with another embodiment of the present invention. Method 200 can be implemented, for example, using the system illustrated with reference to FIG. 1. Accordingly, in step 205, an HDL design can be loaded into a synthesis tool. As noted, the HDL design can comprise synthesizable code for a circuit design to be implemented on some variety of target device (such as a PLD or an ASIC).

In step 210, the synthesis tool can begin compiling the loaded HDL design. In step 215, the synthesis tool can identify any instructions relating to HDL constant functions. Such instructions can be, for example, compiler directives or other statements as described herein. As noted, the HDL constant functions calculate, and thus correspond to, circuit attributes. In step 220, the synthesis tool can identify any HLL functions that have been specified as HDL constant function alternatives or equivalents. The HLL functions can be included within an object library that is accessible to the synthesis tool. The object library, like the particular HLL functions, also can be specified by the instructions identified in step 215.

As noted, using the mechanisms disclosed herein allows a synthesis tool configured to process such directives or statements to substitute HLL functions for HDL constant functions. Synthesis tools that are not configured to identify such directives or statements, however, can simply ignore the directives or statements. Accordingly, an HDL design that has been implemented to take advantage of HLL functions still can be synthesized using a conventional synthesis tool that lacks the ability to utilize HLL functions to compute circuit attributes at compile time. A conventional synthesis tool can execute or utilize the HDL constant functions that are included as part of the HDL design. It should be appreciated, however, that if the HDL design is to be synthesized on a suitably configured synthesis tool, no HDL constant functions need be specified or implemented if HLL functions are specified.

In step 225, any HLL functions identified in step 220 can be called and executed in step 230. In step 235, any output determined or otherwise calculated by the HLL function(s) executed in step 230 can be written to appropriate circuit design attributes, whether written to variables or memory locations corresponding to such attributes. In step 240, the synthesis tool can synthesize the HDL design using the various circuit design attribute(s) determined using the HLL function(s).

The embodiments described herein provide a more efficient technique for determining attributes, which are compile time constants, of HDL circuit designs. By executing HLL functions at compile time in lieu of HDL constant functions, circuit design attributes can be calculated in a more efficient manner. As, such, the use of HLL calls in place of HDL constant functions allows the HDL design to achieve significant complexity in terms of parameterization, while also executing in less time than would be the case were HDL constant functions to be used. Further, as noted, the development and/or maintenance of HLL functions is less cumbersome and time consuming than developing and/or maintaining HDL constant functions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language).

This invention can be embodied in other forms without departing from the spirit or essential attributes thereof. Accordingly, reference should be made to the following claims, rather than to the foregoing specification, as indicating the scope of the invention.

What is claimed is:

1. A method of compiling a Hardware Description Language (HDL) representation of a circuit design using a High-level Language (HLL) function comprising:
   during compilation, by using a computer, of the HDL representation of the circuit design,
      identifying an attribute of the HDL representation of the circuit design for which a value has not been calculated and which is used to parameterize the HDL representation of the circuit design, wherein the value specifies a hardware implementation characteristic of the circuit design;
      determining that the HDL representation of the circuit design comprises an HDL function that is executed to calculate a value for the attribute that parameterizes the HDL representation of the circuit design, wherein the HDL function is not translated into hardware during synthesis of the circuit design, and an HLL function that is executed to calculate a value for the attribute that parameterizes the HDL representation of the circuit design, wherein the HLL function and the HDL function are functionally equivalent alternatives of one another;
      identifying a compilation directive, within the HDL representation of the circuit design, instructing a synthesis tool to select, at compile time, the HLL function to compute the value for the attribute;
      selecting the HLL function to be executed in lieu of the HDL function according to the compilation directive; and
      determining a value for the attribute of the HDL representation of the circuit design by natively executing the HLL function.

2. The method of claim 1, further comprising synthesizing the HDL representation of the circuit design using the value for the attribute determined using the HLL function to parameterize the HDL representation of the circuit design.

3. The method of claim 1, wherein the step of determining the value further comprises:
   calling the HLL function; and
   executing the HLL function.

4. The method of claim 1, wherein the attribute is an HDL constant, wherein the step of determining the value further comprises assigning an output of the HLL function to the HDL constant.

5. The method of claim 1, further comprising specifying an object library to be accessed during compilation of the HDL representation of the circuit design, wherein the object library comprises the HLL function.

6. The method of claim 1, wherein the compilation directive is ignored by the synthesis tool if the synthesis tool does not support HLL functions.

7. A method of compiling a Hardware Description Language (HDL) representation of a circuit design using a High-level Language (HLL) function comprising:
   during compilation, by using a computer, of the HDL representation of the circuit design,
      identifying an HDL constant function within an HDL representation of a circuit design, wherein the HDL constant function computes a value for an attribute of the HDL representation of the circuit design used to parameterize the HDL representation of the circuit design, wherein the value specifies a hardware implementation characteristic of the circuit design, and wherein the HDL constant function is not translated into hardware during synthesis of the circuit design;
      identifying an HLL function that is a functionally equivalent alternative to the HDL constant function, wherein the HLL function is natively executable to calculate a value for the attribute that parameterizes the HDL representation of the circuit design;
      selecting either the HLL function or the HDL constant function according to a compilation directive within the HDL representation of the circuit design; and
      determining a value for the attribute of the HDL representation of the circuit design by natively executing the selected function.

8. The method of claim 7, wherein the selected function is the HLL function, wherein the step of determining the value for the attribute further comprises:
   calling the HLL function; and
   executing the HLL function in lieu of the HDL constant function.

9. The method of claim 8, wherein the attribute is an HDL attribute, wherein the step of determining the value for the attribute further comprises writing output of the HLL function to the HDL attribute otherwise determined by the HDL constant function.

10. The method of claim 7, further comprising synthesizing the HDL representation of the circuit design using the value of the attribute determined using the selected function to parameterize the HDL representation of the circuit design.

11. The method of claim 7, further comprising associating the HDL constant function with the HLL function by instructing a synthesis tool to select the HLL function in lieu of the HDL constant function.

12. The method of claim 11, wherein the step of instructing the synthesis tool further comprises including at least one instruction within the HDL representation of the circuit design that is ignored by the synthesis tool if the synthesis tool does not support HLL functions.

13. The method of claim 7, further comprising specifying an object library to be accessed when compiling the HDL representation of the circuit design, wherein the object library comprises the HLL function.

14. A machine readable storage, having stored thereon a computer program having a plurality of code sections operable during compilation of a Hardware Description Language (HDL) representation of a circuit design, the machine readable storage comprising:
  code for identifying an HDL constant function within an HDL representation of a circuit design, wherein the HDL constant function computes a value for an attribute used to parameterize the HDL representation of the circuit design during compilation of the HDL representation of the circuit design, wherein the value specifies a hardware implementation characteristic of the circuit design, and wherein the HDL function is not translated into hardware during synthesis of the circuit design;
  code for identifying a High-level Language (HLL) function that is a functionally equivalent alternative to the HDL constant function during compilation of the HDL representation of the circuit design, wherein the HLL function is natively executable to calculate a value for the attribute that parameterizes the HDL representation of the circuit design;
  code for selecting either the HLL function or the HDL constant function during compilation of the HDL representation of the circuit design according to a compiler directive; and
  code for determining a value for the attribute of the HDL representation of the circuit design by natively executing the selected function.

15. The machine readable storage of claim 14, wherein the HLL function is the selected function, wherein the code for determining the value for the attribute further comprises code for calling the HLL function, wherein the HLL function is executed in lieu of the HDL constant function.

16. The machine readable storage of claim 14, wherein the attribute is an HDL attribute, wherein the code for determining the value for the attribute further comprises code for writing output of the HLL function to the HDL attribute otherwise determined by the HDL constant function.

17. The machine readable storage of claim 14, further comprising code for synthesizing the circuit design using the value of the attribute determined using the selected function to parameterize the HDL representation of the circuit design.

18. The machine readable storage of claim 14, further comprising code for associating the HDL constant function with the HLL function by instructing a synthesis tool to select the HLL function in lieu of the HDL constant function.

19. The machine readable storage of claim 18, wherein the code for associating the HDL constant function with the HLL function further comprises code specifying an object library to be accessed by the synthesis tool when compiling the HDL representation of the circuit design, wherein the object library comprises the HLL function.

* * * * *